United States Patent
Fang et al.

(10) Patent No.: US 11,742,268 B2
(45) Date of Patent: Aug. 29, 2023

(54) PACKAGE STRUCTURE APPLIED TO POWER CONVERTER

(71) Applicant: Silergy Semiconductor Technology (Hangzhou) LTD, Hangzhou (CN)

(72) Inventors: Chiqing Fang, Hangzhou (CN); Jiaming Ye, Hangzhou (CN); Chen Zhao, Hangzhou (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 183 days.

(21) Appl. No.: 17/243,949

(22) Filed: Apr. 29, 2021

(65) Prior Publication Data

US 2021/0343628 A1 Nov. 4, 2021

(30) Foreign Application Priority Data

May 3, 2020 (CN) .......................... 202010369001.9

(51) Int. Cl.
*H01L 23/495* (2006.01)
*H01L 23/00* (2006.01)

(52) U.S. Cl.
CPC ........ *H01L 23/49575* (2013.01); *H01L 24/41* (2013.01); *H01L 2224/84801* (2013.01); *H01L 2924/13091* (2013.01); *H01L 2924/1425* (2013.01)

(58) Field of Classification Search
CPC ............... H01L 23/49575; H01L 24/41; H01L 2224/84801; H01L 2924/13091; H01L 2924/1425
USPC .......................................... 438/123; 257/666
See application file for complete search history.

(56) References Cited

U.S. PATENT DOCUMENTS

| | | | |
|---|---|---|---|
| 8,581,518 B2 | 11/2013 | Kuang et al. | |
| 10,356,864 B2 * | 7/2019 | Chen .................. | H05B 45/3725 |
| 10,827,583 B2 * | 11/2020 | Wang .................... | H05B 45/31 |
| 2011/0127925 A1 | 6/2011 | Huang et al. | |
| 2017/0318639 A1 | 11/2017 | Wang et al. | |
| 2018/0295685 A1 | 10/2018 | Wang et al. | |
| 2018/0295690 A1 | 10/2018 | Chen et al. | |
| 2018/0310376 A1 | 10/2018 | Huang et al. | |

* cited by examiner

*Primary Examiner* — Caleb E Henry
*Assistant Examiner* — Dilinh P Nguyen

(57) ABSTRACT

A package structure applied to power converters can include: a first die having a first power transistor and a first control and drive circuit; a second die having a second power transistor; a connection device configured to couple the first and second power transistors in series between a high-level pin and a low-level pin of a lead frame of the package structure; and where a common node of the first and second power transistors can be coupled to an output pin of the lead frame through a metal connection structure with a low interconnection resistance.

20 Claims, 10 Drawing Sheets

PACKAGE STRUCTURE APPLIED TO POWER CONVERTER

RELATED APPLICATIONS

This application claims the benefit of Chinese Patent Application No. 202010369001.9, filed on May 3, 2020, which is incorporated herein by reference in its entirety.

FIELD OF THE INVENTION

The present invention generally relates to the field of semiconductor technology, and more particularly to package structures applied to power converters.

BACKGROUND

A switched-mode power supply (SMPS), or a "switching" power supply, can include a power stage circuit and a control circuit. When there is an input voltage, the control circuit can consider internal parameters and external load changes, and may regulate the on/off times of the switch system in the power stage circuit. Switching power supplies have a wide variety of applications in modern electronics. For example, switching power supplies can be used to drive light-emitting diode (LED) loads.

DETAILED DESCRIPTION

Figure 1A:
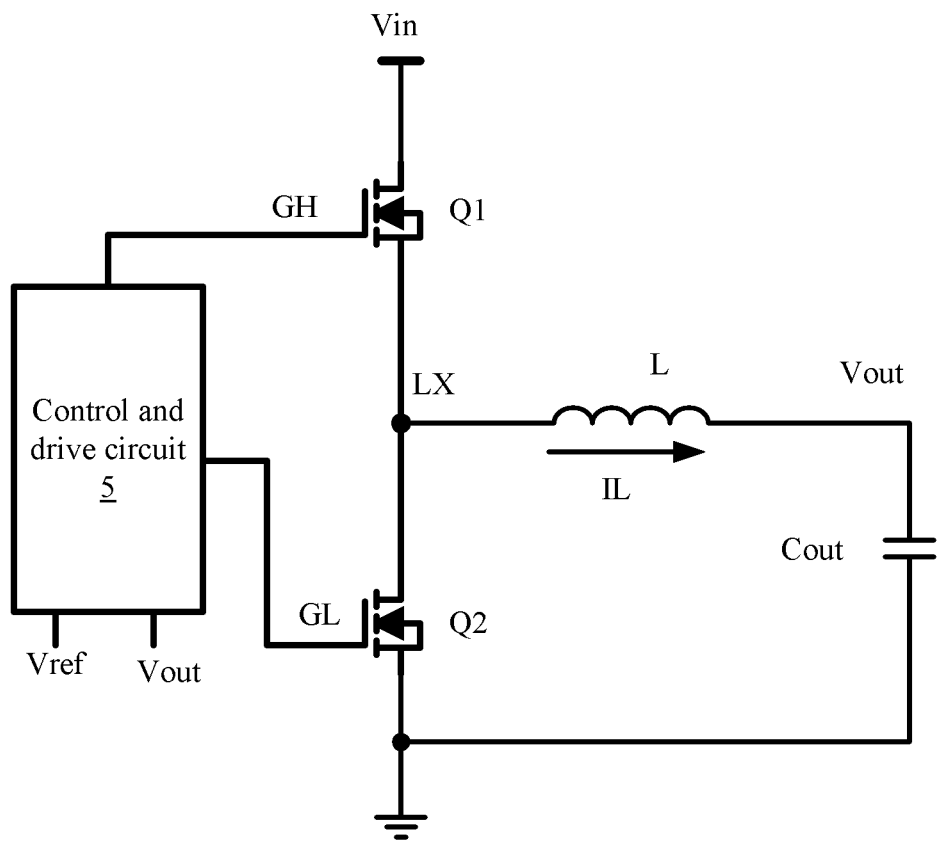
FIG. 1A is a principle diagram of an example buck power converter.

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

A power converter is a conversion circuit that converts an input voltage into a constant output voltage or output current. According to the magnitude relationship between the input voltage and the output voltage, the power converter can be set to different power topologies (e.g., a buck type, a boost type, a buck-boost type, etc.). The power converter can include a main power switch and a rectifier switch, as well as an inductance and an output capacitor. Different connection methods between the four basic devices can be used to obtain different power-level topologies. The control and drive circuit can control the main power switch to operate in a high-frequency state, and control the on-duty ratio of the main power switch according to feedback information of the output voltage, in order to obtain a constant output voltage at the output terminal.

The development of electronic technology has made the requirements for miniaturization and integration increase. Through existing manufacturing processes, the main power switch, the rectifier switch, and the control and drive circuit can be manufactured separately, and then the main power switch, the rectifier switch, and the control and drive circuit can be packaged in a single chip structure through the packaging process. In this way, the area of chip can increase. Another approach is to integrate the main power switch, the rectifier switch, and the control and drive circuit, which can reduce the area of the chip, but the requirements for such a manufacturing process can be stringent.

Unless the context clearly indicates otherwise, each part of the semiconductor device can be made of material(s) well known to one skilled in the art. The semiconductor material can include, e.g., group III-V semiconductor(s), such as GaAs, InP, GaN, and SiC, and group IV semiconductor(s), such as Si and Ge. A gate conductor may be made of any conductive material (e.g., metal, doped polysilicon, a stack of metal and doped polysilicon, etc.). For example, the gate conductor may be made of material selected from a group consisting of TaC, TiN, TaSiN, HfSiN, TiSiN, TiCN, TaAlC, TiAlN, TaN, PtSix, $Ni_3Si$, Pt, Ru, W, and their combinations. A gate dielectric may be made of SiO2, or any material having dielectric constant greater than that of SiO2. For example, the gate dielectric may be made of material selected from a group consisting of oxides, nitrides, oxynitrides, silicates, aluminates, and titanates.

Particular embodiments may provide a package structure applied to power converters that can include: a first die having a first power transistor and a first control and drive circuit; a second die having a second power transistor; a connection device configured to couple the first and second power transistors in series between a high-level pin and a low-level pin of a lead frame of the package structure; and where a common connection node of the first and second power transistors can be coupled to an output pin of the lead frame through a metal connection structure with a low interconnection resistance.

In a first aspect of this package structure, the first power transistor and the control and drive circuit can be integrated on the same die, and the control electrode and the drive signal can be directly connected through a connection structure (e.g., a metal layer) inside the die. In this way, it may longer be necessary to realize a connection outside the die similar, such as the metal bonding method, or implementation of a pin connection outside the package. Such an implementation in certain embodiments can better realize high-frequency switching action of the first power transistor, can increase the operating frequency of the first power transistor, and may reduce the switching loss.

In a second aspect of particular embodiments, the second power transistor can be integrated in a separate second die, the first die and the second die may be separated in the package structure, and the control and drive actions of the second power transistor may not interfere with the first die or have other negative effects, which can improve reliability. In addition, when the second die is only used as the second power transistor, the area of the second die can be made larger, thereby reducing the on-resistance and the conduction loss.

In a third aspect a particular embodiments, the second power transistor can be configured as a power device having a vertical current flow direction. The second power transistor can be configured such that the direction of current flow between first and second power electrodes is vertical. For example, the second die may be a VDMOS transistor or a source down LDMOS transistor. Different from the type of the first power transistor in the first die, e.g., the first power transistor may be an LDMOS transistor. The selection of different types of power transistors can facilitate connection between the first and second power transistors in the package structure, and the first and second power transistors can connect in series between a high potential (e.g., an input voltage source) and a low potential (e.g., a ground potential) by the pins of the package structure, such that the anti-interference ability is enhanced.

On the other hand, the first and second power electrodes of the second power transistor may also be located on the same surface of the second die. The connection between the first power transistor and the high-level pin, the connection between the second power transistor and the low-level pin, and the connection between the first power electrode of the second power transistor and the second power electrode of the second power transistor can be realized by a metal connection structure with a low interconnection resistance, or by a stacking of a direct connection mode. Hereinafter, the description of this particular embodiment can be carried out by taking the power converter as a buck power topology example, and the main power transistor (i.e., the first power transistor) and the rectifier power transistor (i.e., the second power transistor) as MOSFET transistors as examples. Correspondingly, the first power electrode can be the drain electrode of the MOSFET transistor, the second power electrode can be the source electrode of the MOSFET transistor, and the control electrode can be the gate electrode of the MOSFET transistor.

Referring now to FIG. 1A, shown is a principle diagram of an example buck power converter. In the buck topology, a drain of power transistor Q1 may receive input voltage Vin, a source of power transistor Q1 and a drain of power transistor Q2 can be connected together and to one end of inductance L, and a source of power transistor Q2 can connect to the ground potential. Control and drive circuit 5 may generate main switch drive signal GH and rectifier switch drive signal GL according to information of output voltage Vout and information of reference voltage Vref. Main switch drive signal GH can be provided to a gate of power transistor Q1 to control the switching action of power transistor Q1, and rectifier switch drive signal GL may be provided to a gate of power transistor Q2 to control the switching action of power transistor Q2. Through this cycle-by-cycle high-frequency control, output voltage Vout can be maintained to be consistent with reference voltage Vref.

Figure 1B:
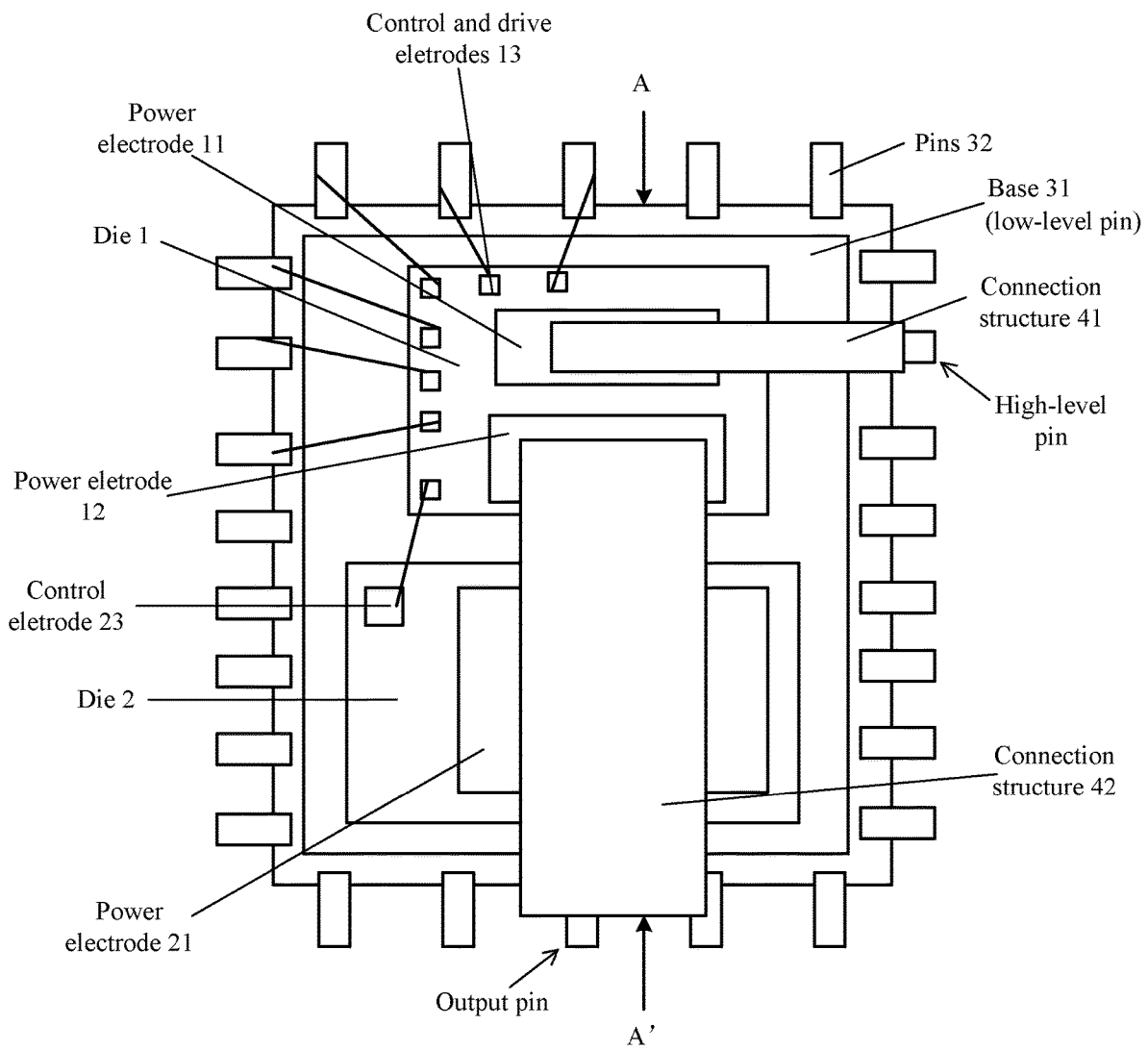
FIG. 1B is a schematic block diagram of a first example package structure applied to a power converter, in accordance with embodiments of the present invention.

Referring now to FIG. 1B, shown is a schematic block diagram of a first example package structure applied to a power converter, in accordance with embodiments of the present invention. This example package structure can include die 1, die 2, a lead frame, and a connection device. Die 1 may integrate the main power transistor and the control and drive circuit. Power electrode 11 (e.g., drain electrode), power electrode 12 (e.g., source electrode), and control and drive electrodes 13 can all be located on the same surface (e.g., upper surface) of die 1.

Die 2 may integrate a single rectifier power transistor. Power electrode 21 (e.g., drain electrode) and the second power electrode (e.g., source electrode) can be located on different surfaces of die 2, such that the current flowing through power electrode 21 (e.g., drain electrode) and the second power electrode of die 2 (e.g., source electrode) can flow in the vertical direction. Here, power electrode 21 (e.g., drain electrode) can be located on an upper surface of die 2, and the second power electrode (e.g., source electrode) can be located on a lower surface of die 2 (not shown). Control electrode 23 can be located on the upper surface or the lower surface of die 2. In this example, control electrode 23 and power electrode 21 (e.g., drain electrode) may both be located on the upper surface of die 2.

The lead frame can include base 31 located in an inner area, and pins 32 located in an outer edge area. Base 31 can provide mechanical support and necessary electrical connections for die 1 and die 2. Here, die 1 and die 2 may be arranged side by side, and both can be located on an upper surface of base 31. The connection device can connect different electrodes that need to be electrically connected inside the package structure. The connection device can include connection structures 41 and 42. In the buck topology, the drain electrode of the first power transistor may receive the input voltage, the source electrode of the first power transistor and the drain electrode of the second power transistor can be connected to one end of the inductance, while the source electrode of the second power transistor can connect to a ground potential.

In order to realize the above connection relationship, the drain electrode of the first power transistor can connect to corresponding pin 32 used to receive the input voltage source through connection structure 41, thereby realizing connectivity between the drain electrode of the first power transistor and the input voltage source. Connection structure 41 can be configured as a sheet-shaped connection structure, which has a larger area and a lower on-resistance in order to accommodate a larger current. Connection structure 41 may be a structure such as a copper clip, the drain electrode of the first power transistor can connect to the copper clip and by a solder layer located on the copper clip and the drain region of the first power transistor, and can connect to a corresponding pin of the lead frame through the copper clip. The source electrode of the first power transistor and the drain electrode of the second power transistor can connect through connection structure 42. The source electrode (not shown)

located on the lower surface of die 2 can be understood to be connected to the corresponding pin through another conductive connection structure.

Control and drive electrodes 13 of die 1 and the electrodes (e.g., source electrode and drain electrode) of the first power transistor can be located on the same surface (e.g., upper surface) of die 1. Control and drive electrodes 13 and the electrodes of the first power transistor may be arranged such that the electrodes of the first power transistor and the control and drive electrode 13 are located on opposite sides of the upper surface of die 1. Therefore, when the performance of the first power transistor needs to be improved (e.g., withstanding voltage, current, etc.) along a direction away from the control and drive electrode, the size of the first power transistor can be increased without the influence of the position of control and drive electrodes 13, while the position of original control and drive electrodes 13 can be maintained. In this example, control electrode 23 (e.g., gate electrode) of die 2 and control and drive electrodes 13 of die 1 may both be located on the surface away from base 31. Therefore, the control and drive electrodes corresponding to drive signal GL generated by the control and drive circuit in die 1 can connect to control electrode 23 of die 2 through a metal connection structure (e.g., a bonding wire) inside the package structure.

Figure 1C:
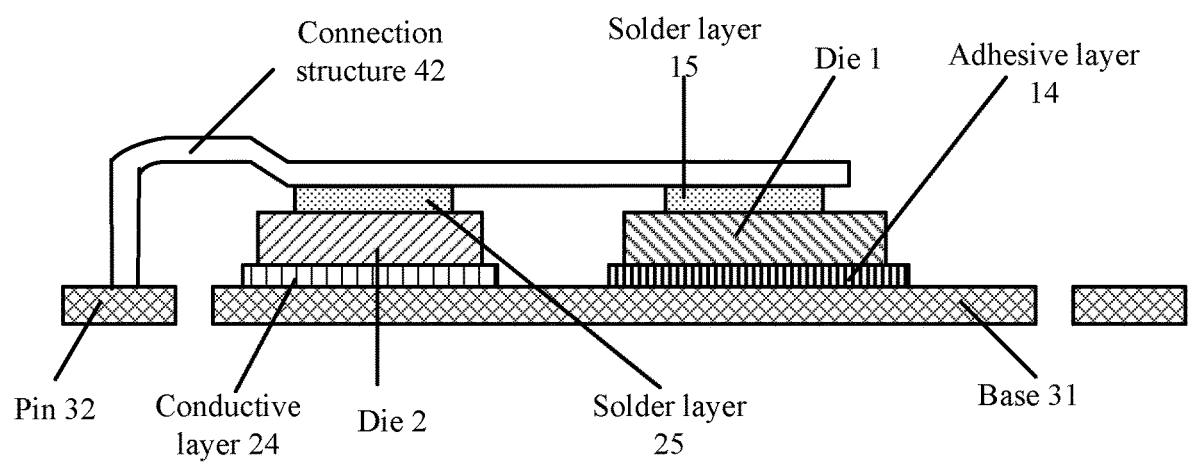
FIG. 1C is a first example cross-sectional view along A-A' of the package structure applied to the power converter shown in FIG. 1B, in accordance with embodiments of the present invention.

Referring now to FIG. 1C, shown is a first example cross-sectional view along A-A' of the package structure applied to the power converter shown in FIG. 1B, in accordance with embodiments of the present invention. In this example, the source electrode of the first power transistor and the drain electrode of the second power transistor can connect through connection structure 42. Connection structure 42 may be configured as a copper clip structure. The drain electrode on the upper surface of die 2 can connect to the copper clip structure through solder layer 25. The source electrode on the upper surface of die 1 may also be connected to the copper clip structure through solder layer 15. Therefore, the source electrode of the first power transistor and the drain electrode of the second power transistor can connect together through the copper clip structure and lead to the corresponding pin 32 through the copper clip structure.

The source electrode located on a lower surface of die 2 can be led out through conductive layer 24. For example, conductive layer 24 can be directly connected to patterned base 31 and then lead the source electrode of die 2 to corresponding pin 32. It can be understood that the conductive layer may include a solder layer and a metal layer, or only a conductive structure in different forms, such as an adhesive conductive layer. In another example, conductive layer 24 may be configured as a redistribution layer structure to lead the source electrode of die 2 to corresponding pin 32. An adhesive layer may be provided between the redistribution layer structure and base 31, in order to mount die 2 on base 31. A lower surface of die 1 can be installed on base 31 by insulating adhesive layer 14. The large-area sheet-shaped copper clip structure can withstand larger currents, and may have a smaller on-resistance in order to reduce losses.

Figure 1D:
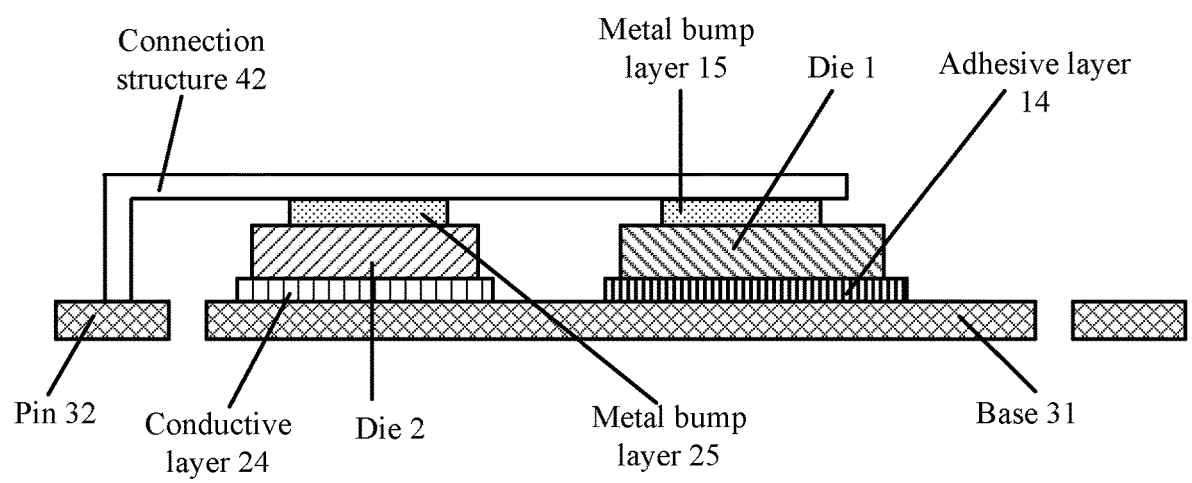
FIG. 1D is a second example cross-sectional view along A-A' of the package structure applied to the power converter shown in FIG. 1B, in accordance with embodiments of the present invention.

Referring now to FIG. 1D, shown is a second example cross-sectional view along A-A' of the package structure applied to the power converter shown in FIG. 1B, in accordance with embodiments of the present invention. In this particular example, connection structure 42 can be configured as a redistribution metal structure. The drain electrode on the upper surface of die 2 can connect to redistribution metal structure through metal bump layer 25. The source electrode on the upper surface of die 1 may also be connected to redistribution metal structure 42 through metal bump layer 15. Therefore, the source electrode of the first power transistor and the drain electrode of the second power transistor can connect together through redistribution metal structure 42, and may be led out to corresponding pin 32 through redistribution metal structure 42.

Similarly, a large-area sheet-shaped redistribution metal structure can withstand larger currents, and may have a smaller on-resistance to reduce losses. It should be understood that the package structure shown in FIGS. 1C and 1D only show a schematic block diagram of the electrical connection relationship between the source electrode, the drain electrode, and the pin. The upper and lower surfaces of the solder layer or the metal bump layer, and the upper and lower surfaces of conductive layer 24 can be arranged as possible other layers. The package structure in particular embodiments can also include an encapsulation body for encapsulating the lead frame, die 1, die 2, and the connection device, and for exposing the pins of the lead frame to the outside of the encapsulation body, in order to realize external connectivity through the pins.

Figure 2A:
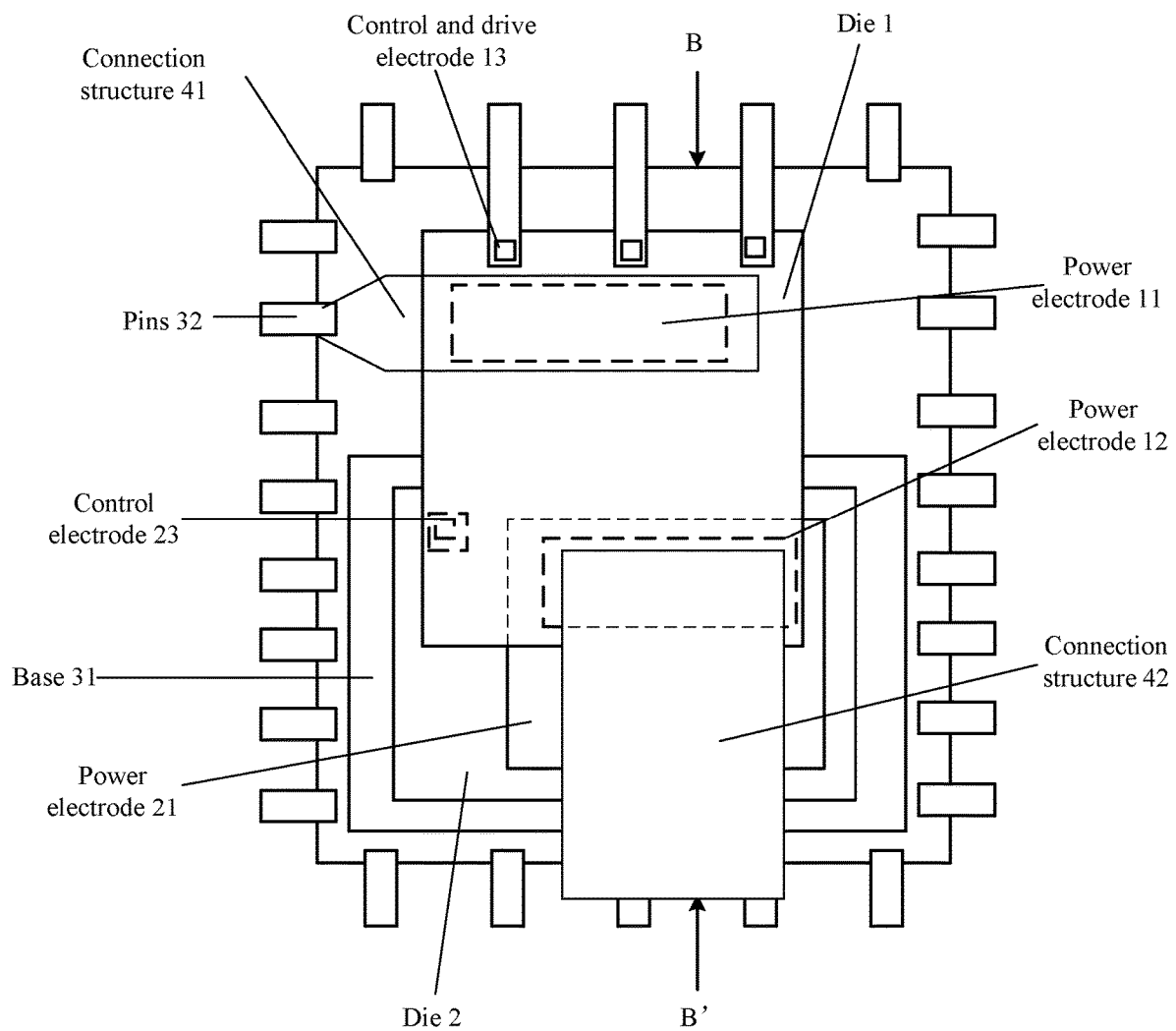
FIG. 2A is a schematic block diagram of a second example package structure applied to a power converter, in accordance with embodiments of the present invention.

Referring now to FIG. 2A, shown is a schematic block diagram of a second example package structure applied to a power converter, in accordance with embodiments of the present invention. In this particular example, die 1 and die 2 are arranged in a stacked mode, can further reduce the package area. For example, die 2 can be directly mounted on base 31 in an active face-up, and die 1 may be flip-mounted above die 2. Also, according to the electrode distribution of die 1, along the vertical direction, die 1 and die 2 may partially overlap. An area of power electrode 21 (e.g., drain electrode) of the second power transistor, and an area of power electrode 12 (e.g., source electrode) of the first power transistor, can overlap along the vertical direction of the package structure.

An area of power electrode 12 (e.g., source electrode) of the first power transistor may be located above an area of power electrode 21 (e.g., drain electrode) of the second power transistor, such that power electrode 12 (e.g., source electrode) of the first power transistor can be directly connected to power electrode 21 (e.g., drain electrode) of the second power transistor. For example, power electrode 12 (e.g., source electrode) of the first power transistor and the power electrode 21 (e.g., drain electrode) of the second power transistor can connect by connection structure 42 between them, and can connect to the corresponding pin 32 of the lead frame by connection structure 42.

Control electrode 23 of die 2 and the corresponding control and drive electrode 13 of die 1 can connect within the package structure through a metal connection structure. For example, a position of a pad corresponding to control electrode 23 of die 2, and a positions of a pad corresponding control and drive electrodes 13 of die 1 corresponding to control electrode 23, can be arranged such that they overlap in the vertical direction. In this way, the two can be electrically connected through the metal bumps, which can result in a relatively high connection reliability. If the pad corresponding to control electrode 23 of die 2, and the pad corresponding to control and drive electrodes 13 of die 1, cannot meet the above-mentioned vertical positional relationship, the connection between them can also be realized by the redistribution layer process.

The remaining control and drive electrodes 13 of die 1 can be arranged on patterned pins 32 through a flip-chip package process. The connection between power electrode 11 of die 1 and corresponding pin 32 can be accomplished by a metal bump between power electrode 11 of die 1 and patterned pin 32, or can through the redistribution layer process. As compared with the package structure shown in FIG. 1A, the package structure shown in FIG. 2A may have a further reduced package area, and the interconnection between the die and the pins and between the dies may not use metal wire bonding, such that the reliability is higher.

Figure 2B:
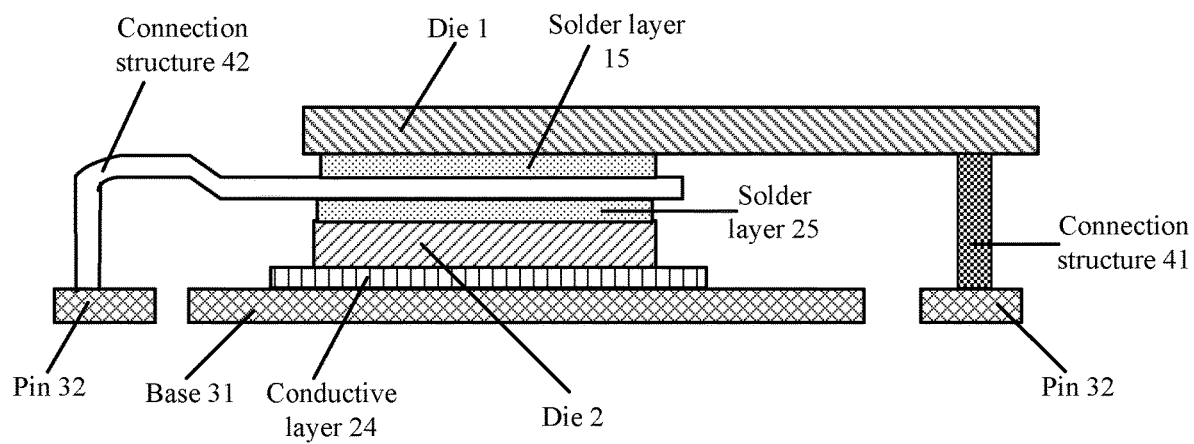
FIG. 2B is an example cross-sectional view along B-B' of the package structure applied to the power converter shown in FIG. 2A, in accordance with embodiments of the present invention.

Referring now to FIG. 2B, shown is an example cross-sectional view along B-B' of the package structure applied to the power converter shown in FIG. 2A, in accordance with embodiments of the present invention. In this example, the source electrode of the first power transistor and the drain electrode of the second power transistor can connect through connection structure 42. Connection structure 42 may be configured as a copper clip structure. The drain electrode on the upper surface of die 2 can connect to the copper clip structure through solder layer 25. The source electrode on the upper surface of die 1 may also be connected to the copper clip structure through solder layer 15. Therefore, the source electrode of the first power transistor and the drain electrode of the second power transistor can be connected together through the copper clip structure and lead to the corresponding pin 32 through the copper clip structure.

The connection between first power electrode of die 1 and pin 32 may be realized by connection structure 41. Connection structure 41 may be configured as a metal bump, where one end of the metal bump is connected to pin 32, and the other end of the metal bump is connected to the solder pad or metal layer corresponding to the first power electrode of die 1, such that power electrode 11 of die 1 is led out through the pin 32. The source electrode located on the lower surface of die 2 can be led out through conductive layer 24. For example, conductive layer 24 can be directly connected to patterned base 31 and then lead to corresponding pin 32. The conductive layer may include a solder layer and a metal layer, or only a conductive structure in different forms, such as an adhesive conductive layer. For example, conductive layer 24 may be configured as a redistribution layer structure to lead the source electrode of die 2 to the corresponding pin 32. An adhesive layer may be provided between the redistribution layer structure and base 31 to mount die 2 on base 31.

Connection structure 42 may also be configured as a redistribution metal structure 42. The drain electrode on the upper surface of die 2 can connect to the redistribution metal structure 42 through a first metal bump layer. The source electrode on the upper surface of die 1 may also be connected to the redistribution metal structure 42 through a second metal bump layer. Therefore, the source electrode of the first power transistor and the drain electrode of the second power transistor can connect together through redistribution metal structure 42, and may be led out to corresponding pin 32 through redistribution metal structure 42.

Such a large-area sheet-shaped copper clip structure or redistribution metal structure can withstand larger currents, and may have a smaller on-resistance to reduce losses. It should be understood that the package structure shown in FIG. 2B only shows a schematic block diagram of the electrical connection relationship between the source electrode and the pin. The upper and lower surfaces of soldering layers 15 and 25, and the upper and lower surfaces of conductive layer 24, can be arranged including other layers. This example package structure can also include an encapsulation body for encapsulating the lead frame, die 1, die 2, and the connection device, and for exposing the pins of the lead frame to the outside of the encapsulation body, in order to realize external connectivity through the pins.

In particular embodiments, the gate electrode and drain electrode of die 2 can be located on the same surface. The gate electrode of die 2 may also be located on a surface different from the drain electrode, but on the same surface as the source electrode. The electrical connection between the gate electrode and control and drive electrode can be realized outside the package by leading out the gate electrode to the corresponding pin, and leading out the corresponding control and drive electrode to the same pin.

The connection between the source electrode of die 2 and the corresponding pin can include the source electrode on the back of die 2 being directly mounted on the large-area patterned pin as a pin connection structure, which can be beneficial to the chip heat dissipation. During the packaging process, the back of the pin connection structure can also be exposed, in order to further improve the heat dissipation capacity. In addition, the control and drive circuit of the second power transistor can be integrated in die 1. The corresponding electrodes of the control and drive circuit and the second power transistor can be electrically connected in the package structure, or through the pins of the package structure.

In the examples as shown in FIGS. 1B and 2A, the area of the first power electrode and the area of the second power electrode of die 1 have been divided, and occupy different large area of the upper surface of die 1, respectively, in order to facilitate the subsequent interconnection between different electrodes and the connection between the electrodes and the pins of the lead frame. Hereinafter, an example implementation for realizing the area setting of the first power electrode and the second power electrode of die 1 will be described.

Figure 3A:
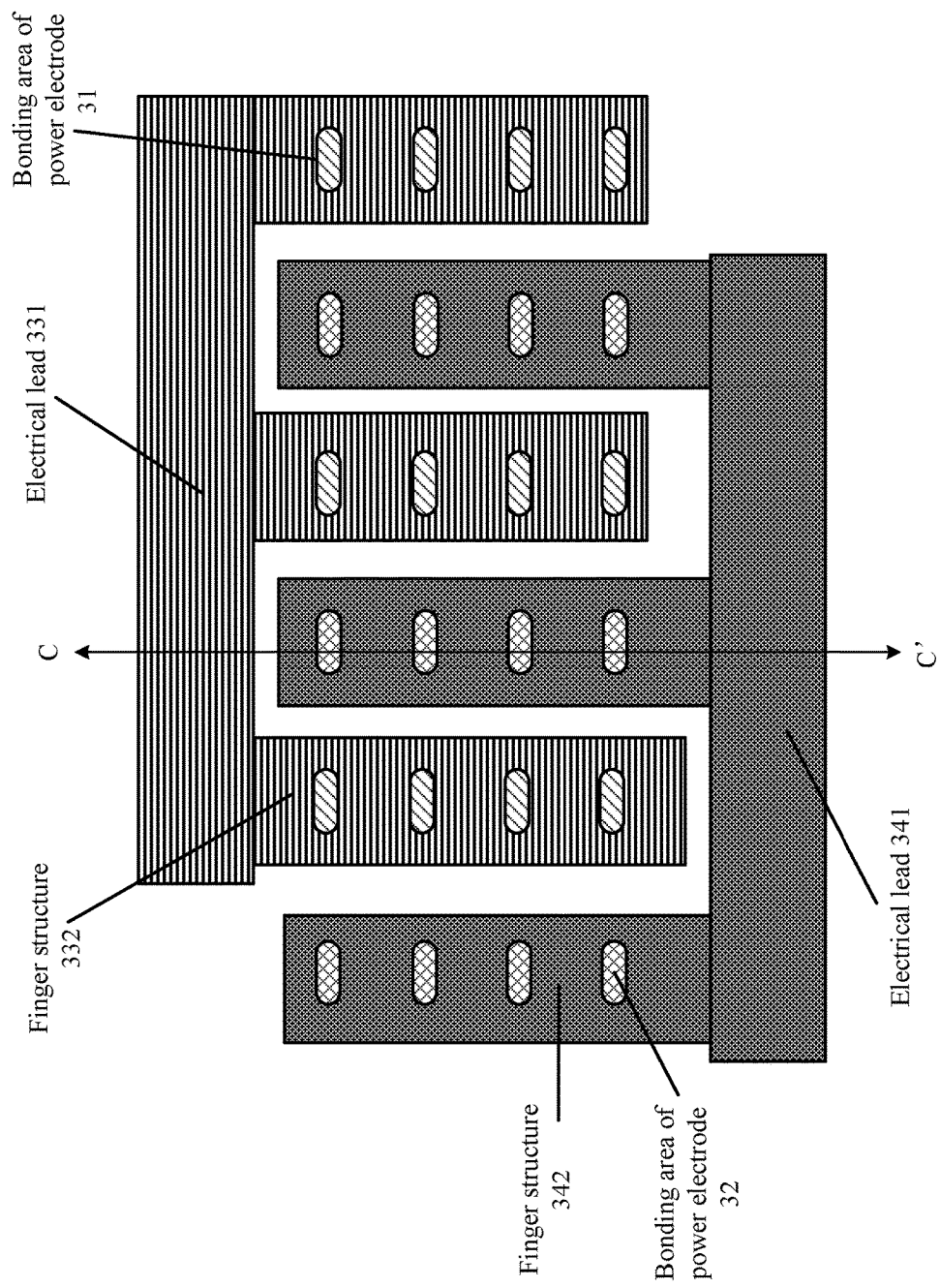
FIG. 3A is a schematic block diagram of an example power electrode lead-out structure of a first die, in accordance with embodiments of the present invention.

Referring now to FIG. 3A, shown is a schematic block diagram of an example power electrode lead-out structure of a first die, in accordance with embodiments of the present invention. Still taking the MOSFET transistor as an example, the first power electrode can be the drain electrode, and the second power electrode can be the source electrode. In this particular example, die 1 can include a plurality of cell units. Each cell unit can be continuously arranged in a continuous drain-gate-source form and connected in parallel with each other. For convenience of explanation, only the arrangement of drain and source electrodes are shown in the figure. For example, the drain and source can be arranged in cross and parallel. A patterned first connection structure can connect all the drain electrodes together. For example, the patterned first connection structure can include finger structures 332 and electrical lead 331. Bonding area 31 of the first power electrode can be the area where finger structure 332 and the drain electrode of die 1 are bonded, such that the patterned first connection structure has the same potential as the drain electrode of die 1.

Similarly, a patterned second connection structure can connect all the source electrodes together. For example, the patterned second connection structure can include finger structures 342 and electrical lead 341. Bonding area 32 of the second power electrode can be the area where finger structure 342 and source electrode of die 1 are bonded, such that the patterned second connection structure has the same potential as the source electrode of die 1. Through the patterned first and second connection structures, the drain and the source can be respectively arranged in different areas. For example, the first and second connection structures can be configured as redistribution metal structure(s).

Figure 3B:
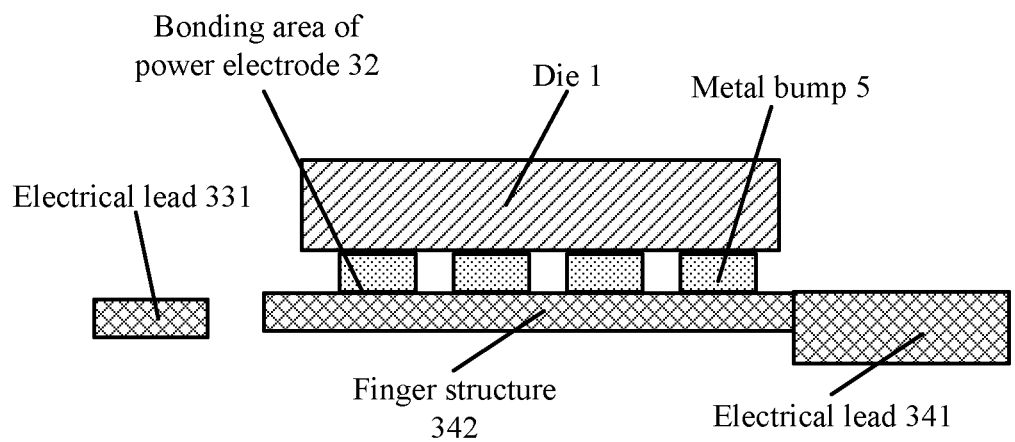
FIG. 3B is a cross-sectional view along C-C' of the power electrode lead-out structure of the first die shown in FIG. 3A, in accordance with embodiments of the present invention.

Referring now to FIG. 3B, shown is a cross-sectional view along C-C' of the power electrode lead-out structure of die 1 shown in FIG. 3A, in accordance with embodiments of the present invention. A pad of source electrode of die 1 can connect to finger structure 342 through metal bump 5, and the bonding area between the pad of source electrode of die 1 and finger structure 342 can be bonding area 32 of the second power electrode. It may also be a connection structure other than metal bump 5, such as a solder layer or a solder ball or other connection structure. With the power electrode lead-out structure shown in FIGS. 3A and 3B, the source electrode and the drain electrode can be arranged in areas on opposite sides. The source electrode led out through electrical lead 341 can be located at an area close to die 2.

The source electrode of die 1 and the drain electrode of die 2 can be connected through the aforementioned large-area sheet-shaped connection structure, such as a copper clip, in order to connect electrical lead 341 of patterned second connection structure with the drain electrode of die 2. The drain electrode of die 1 and the pin can also be connected through the large-area sheet-shaped connection structure, such as a copper clip, in order to connect electrical lead 331 and the pin. The power electrode lead-out structure of die 1 can also be realized by layered patterned first and second connection structures with different heights. For example, the patterned first connection structure connected to the pad of the drain electrode may have a relatively high height. The height of the patterned second connection structure connected to the pad of the source electrode can be relatively low, and the source electrode and the drain electrode can also be arranged in areas on opposite sides.

Figure 4A:
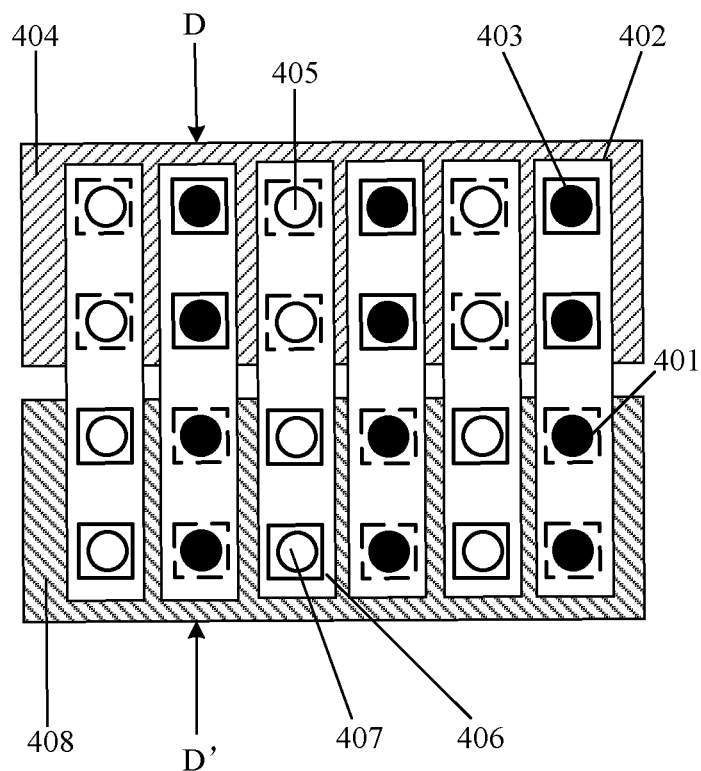
FIG. 4A is a schematic block diagram of another example power electrode lead-out structure of a first die, in accordance with embodiments of the present invention.
Figure 4B:
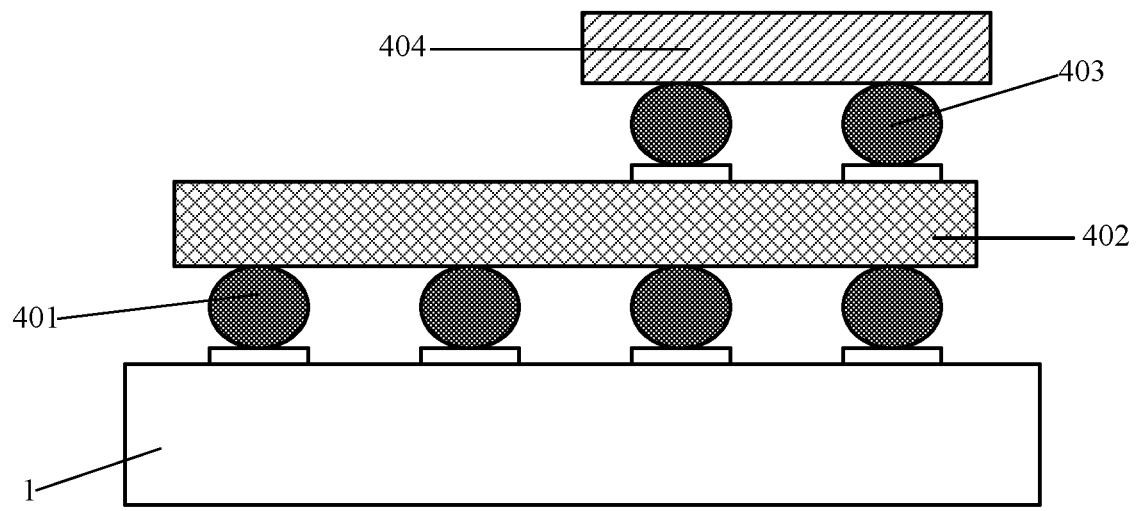
FIG. 4B is a cross-sectional view along D-D' of the power electrode lead-out structure of the first die shown in FIG. 4A, in accordance with embodiments of the present invention.

Referring now to FIG. 4A, shown is a schematic block diagram of another example power electrode lead-out structure of a first die, in accordance with embodiments of the present invention. Referring also to FIG. 4B, shown is a cross-sectional view along D-D' of the power electrode lead-out structure of the first die shown in FIG. 4A, in accordance with embodiments of the present invention. Still taking the MOSFET transistor as an example, the first power electrode can be the drain electrode, and the second power electrode can be the source electrode. The patterned redistribution metal structure can include a first metal layer, a solder structure, and a second metal layer. The first surface of the first metal layer can connect to the electrode lead of the same potential, and the solder structure can connect to the second surface of the first metal layer. The electrode potential can be re-distributed to the corresponding area of die 1. The first surface of the second metal layer can connect to the solder structure, and can connect to the outside through the second surface of the second metal layer.

For example, the patterned redistribution metal structure can include a first metal layer, solder structure, and a second metal layer. According to the matrix arrangement of the solder balls on the die 1, the patterned redistribution metal structure (e.g., drain redistribution unit) can connect to drain solder ball 401 through the first surface of metal layer 402 (e.g., drain), and can connect to metal layer 404 located at the upper area through solder structure 403 (e.g., the solder ball structure) on the second surface of metal layer 402 to lead the drain electrode to the upper half area of die 1. Similarly, the redistribution metal structure (e.g., source redistribution unit) can connect to source solder ball 405 through the first surface of metal layer 406 (e.g., source), and can connect to metal layer 408 located at the lower area through solder structure 407 (e.g., the solder ball structure) on the second surface of metal layer 406 to lead the source electrode to the lower half area of die 1, thereby dividing the drain electrode and the source electrode into two independent and non-overlapping areas.

The area and thickness of the second metal layer can be set to a larger value, which may reduce the resistance of the current conduction path, and reduce power loss, while achieving electrical connection. In addition to the connection structures other than the wafer exemplified above, such as the first and second connection structures, to realize the rearrangement of the drain potential and the source potential, the drain potential and source potential can be redistributed at the wafer-level, such as through the metal layer of the wafer. Therefore in particular embodiments, the connection structure between the different electrode potentials, and the connection structure between the electrode potentials and the pins, may refer to the connection member that can connect the different potentials together, and may include one or more different parts, where each part can be integrated or separate, can be of the same or different materials, and/or can include parts outside the wafer and parts inside the wafer.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A package structure applied to a power converter, the package structure comprising:
 a) a first die comprising a first power transistor and a first control and drive circuit;
 b) a second die comprising a second power transistor;
 c) a connection device configured to couple the first power transistor and the second power transistor in series between a high-level pin and a low-level pin of a lead frame that is inside the package structure; and
 d) wherein, a common connection point of the first power transistor and the second power transistor is coupled to an output pin of the lead frame through a metal connection structure with low interconnection resistance.

2. The package structure of claim 1, wherein the second power transistor is configured as a power device having a vertical current flow direction.

3. The package structure of claim 1, wherein a connection between the first power transistor and the high-level pin, and a connection between the second power transistor and the low-level pin, are realized by a metal connection structure with a low interconnection resistance or by a stacking of direct connections.

4. The package structure of claim 3, wherein the metal connection structure with the low interconnection resistance is configured as a sheet-shaped metal clip structure or a redistribution metal structure.

5. The package structure of claim 1, wherein a control electrode, a first power electrode, and a second power electrode of the first power transistor are located on a same surface of the first die.

6. The package structure of claim 5, wherein a first power electrode and a second power electrode of the second power transistor are located on different surfaces of the second die.

7. The package structure of claim 6, wherein the first die and the second die are arranged side-by-side.

8. The package structure of claim 7, wherein the connection device comprises a metal clip structure configured to be electrically coupled to the second power electrode of the first power transistor and the first power electrode of the second power transistor through a solder layer, and to be connected to a corresponding pin of the lead frame.

9. The package structure of claim 7, wherein the connection device comprises a redistribution metal structure, and the second power electrode of the first power transistor and the first power electrode of the second power transistor are connected to the redistribution metal structure through a solder process and connected to a corresponding pin of the lead frame by the redistribution metal structure.

10. The package structure of claim 6, wherein the first die and the second die are arranged in a stacked configuration.

11. The package structure of claim 10, wherein the second die is mounted in an active face-up position, and the first die is flipped and partially stacked above the second die.

12. The package structure of claim 11, wherein an area of the second power electrode of the first power transistor, and an area of the first power electrode of the second power transistor, overlap along a vertical direction of the package structure.

13. The package structure of claim 12, wherein:
a) the connection device comprises a metal connection structure;
b) the first surface of the metal connection structure is electrically connected to the second power electrode of the first power transistor through a solder structure;
c) the second surface of the metal connection structure is electrically connected to the first power electrode of the second power transistor through a solder structure; and
d) the second power electrode of the first power transistor and the first power electrode of the second power transistor are connected to a corresponding pin of the lead frame through the metal connection structure.

14. The package structure of claim 12, wherein a drive electrode of the first control and drive circuit is connected to a control electrode of the second power transistor through the metal connection structure, and the control electrode of the second power transistor and the first power electrode of the second power transistor are located on a same surface.

15. The package structure of claim 14, wherein the metal connection structure is configured as a metal bump or a redistribution metal structure.

16. The package structure of claim 5, wherein a potential area of the first power electrode of the first power transistor, and a potential area of the second power electrode of the first power transistor, are located on opposite sides of the first die, and wherein the potential area of the second power electrode of the first power transistor is located at a side closest to the second die.

17. The package structure of claim 16, wherein the connection device comprises a metal connection structure with a low interconnection resistance having a first connection structure connected the first power electrode of the first power transistor and to a corresponding pin of the lead frame, and a second connection structure connected the second power electrode of the first power transistor and to a corresponding pin of the lead frame.

18. The package structure of claim 17, wherein the metal connection structure with the low interconnection resistance is configured as a patterned redistribution metal structure.

19. The package structure of claim 18, wherein the patterned redistribution metal structure comprises an electrical lead and finger structures, the finger structures are connected to an electrode lead-out structure, and the electrical lead is connected to the finger structures to lead out the corresponding potential.

20. The package structure of claim 18, wherein:
a) the patterned redistribution metal structure comprises a first metal layer, a solder structure, and a second metal layer;
b) a first surface of the first metal layer is connected to an electrode lead-out of the same potential;
c) the solder structure is connected to a second surface of the first metal layer;
d) the electrode potential is re-distributed to a corresponding area of the first die; and
e) a first surface of the second metal layer is connected to the solder structure, and outside of the package structure through the second surface of the second metal layer.

* * * * *